(12) United States Patent
Baek

(10) Patent No.: US 12,125,874 B2
(45) Date of Patent: Oct. 22, 2024

(54) MANUFACTURING METHOD OF SEMICONDUCTOR STRUCTURE AND SEMICONDUCTOR STRUCTURE

(71) Applicant: CHANGXIN MEMORY TECHNOLOGIES, INC., Hefei (CN)

(72) Inventor: Kyoungyoon Baek, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 343 days.

(21) Appl. No.: 17/647,481

(22) Filed: Jan. 10, 2022

(65) Prior Publication Data

US 2023/0016959 A1   Jan. 19, 2023

Related U.S. Application Data

(63) Continuation of application No. PCT/CN2021/112189, filed on Aug. 12, 2021.

(30) Foreign Application Priority Data

Jul. 16, 2021   (CN) .......................... 202110805755.9

(51) Int. Cl.
*H01L 23/522*   (2006.01)
*H01L 49/02*    (2006.01)
*H10B 12/00*    (2023.01)

(52) U.S. Cl.
CPC .................................. *H01L 28/92* (2013.01)

(58) Field of Classification Search
CPC ......... H01L 28/90; H01L 28/92; H01L 28/86; H01L 23/5223; H10B 12/033
See application file for complete search history.

(56) References Cited

U.S. PATENT DOCUMENTS

| 7,153,740 B2 | 12/2006 | Kim et al. |
| 10,276,668 B2 | 4/2019 | Kim |
| 2007/0052115 A1 | 3/2007 | Manning et al. |

(Continued)

FOREIGN PATENT DOCUMENTS

| CN | 1655339 A | 8/2005 |
| CN | 108183097 A | 6/2018 |

OTHER PUBLICATIONS

International Search Report and Written Opinion cited in PCT/CN2021/112189 mailed Apr. 13, 2022, 9 pages.

*Primary Examiner* — Omar F Mojaddedi
(74) *Attorney, Agent, or Firm* — Syncoda LLC; Feng Ma

(57) ABSTRACT

The present disclosure provides a method of manufacturing a semiconductor structure, and a semiconductor structure. The method of manufacturing a semiconductor structure includes: providing an initial structure, wherein the initial structure includes a substrate, a laminated structure, and capacitor units, and the laminated structure includes support layers; forming a first mask layer, wherein the first mask layer covers a top surface of the laminated structure; forming a first opening in the first mask layer, wherein the first opening exposes the top surface of the laminated structure, and a projection region of the first opening on the substrate at least partially overlaps with projection regions of the capacitor units on the substrate; forming a shielding structure, wherein the shielding structure is located in the first opening, and the shielding structure covers a sidewall of the first opening.

15 Claims, 19 Drawing Sheets

(56) References Cited

U.S. PATENT DOCUMENTS

| | | | |
|---|---|---|---|
| 2009/0257169 A1 | 10/2009 | Chen et al. | |
| 2010/0047992 A1* | 2/2010 | Kuan | H01L 28/90 |
| | | | 257/E21.008 |
| 2013/0249053 A1 | 9/2013 | Lee | |
| 2013/0250477 A1 | 9/2013 | Lim | |
| 2014/0065785 A1* | 3/2014 | Yoon | H01L 28/91 |
| | | | 438/381 |
| 2015/0348963 A1* | 12/2015 | Hung | H10B 12/033 |
| | | | 257/532 |
| 2018/0166542 A1* | 6/2018 | Kim | H10B 12/00 |
| 2019/0081134 A1* | 3/2019 | Chang | H01L 28/92 |
| 2021/0202490 A1 | 7/2021 | Cho et al. | |

* cited by examiner

MANUFACTURING METHOD OF SEMICONDUCTOR STRUCTURE AND SEMICONDUCTOR STRUCTURE

CROSS-REFERENCE TO RELATED APPLICATIONS

This is a continuation of International Application No. PCT/CN2021/112189, filed on Aug. 12, 2021, which claims the priority to Chinese Patent Application 202110805755.9, titled "MANUFACTURING METHOD OF SEMICONDUCTOR STRUCTURE AND SEMICONDUCTOR STRUCTURE" and filed on Jul. 16, 2021. The entire contents of International Application No. PCT/CN2021/112189 and Chinese Patent Application 202110805755.9 are incorporated herein by reference.

TECHNICAL FIELD

The present disclosure relates to, but is not limited to, a method of manufacturing a semiconductor structure and a semiconductor structure.

BACKGROUND

As the integration of a dynamic random access memory (DRAM) increases, the size of a storage node and the area of an electrode plate decrease continuously. However, the DRAM needs to have higher charge storage capacity.

Currently, in order to meet the charge storage capacity of the DRAM, the height of the DRAM is increased continuously. As the DRAM becomes higher, the DRAM is more prone to tipping. To reduce the risk of DRAM tipping, a support layer is needed in middle and upper regions of a capacitor structure. However, as the thickness of the support layer increases, it occupies the space of the capacitor structure and affects the charge storage capacity of the capacitor structure.

SUMMARY

An overview of the subject matter detailed in the present disclosure is provided below, which is not intended to limit the protection scope of the claims.

The present disclosure provides a method of manufacturing a semiconductor structure and a semiconductor structure.

According to a first aspect, the present disclosure provides a method of manufacturing a semiconductor structure. The manufacturing method includes: providing an initial structure, wherein the initial structure includes a substrate, a laminated structure formed on the substrate, and capacitor units formed in the laminated structure, and the laminated structure includes support layers;

forming a first mask layer, wherein the first mask layer covers a top surface of the laminated structure;

forming a first opening in the first mask layer, wherein the first opening exposes the top surface of the laminated structure, and a projection region of the first opening on the substrate at least partially overlaps with projection regions of the capacitor units on the substrate;

forming a shielding structure, wherein the shielding structure is located in the first opening, and the shielding structure covers a sidewall of the first opening; and removing a part of the support layers according to a pattern defined by the shielding structure, wherein a remaining part of the support layers form a support structure of the capacitor units.

According to a second aspect, the present disclosure provides a semiconductor structure. The semiconductor structure includes:

a substrate, wherein capacitor contact regions are provided in the substrate;

capacitor units, wherein the capacitor units are provided on the substrate and connected to the capacitor contact regions respectively; and a support structure, wherein the support structure is connected to partial sidewalls of some of the capacitor units.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

Figure 28:
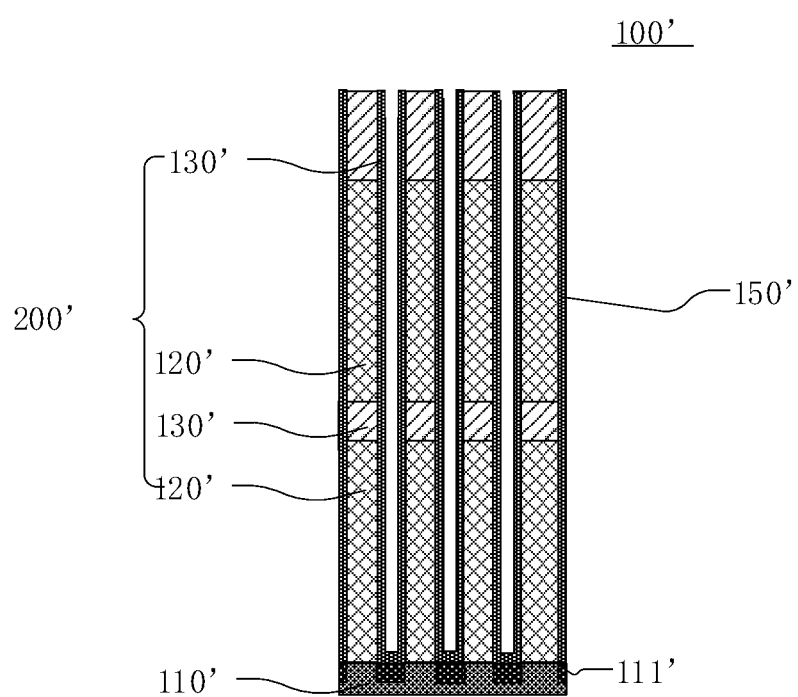
FIG. 28 is a schematic diagram of an initial structure provided in a method of manufacturing a semiconductor structure according to an exemplary comparative embodiment.

In the existing method of manufacturing a semiconductor structure, as shown in FIG. 28, the method of manufacturing a semiconductor structure includes: providing an initial structure 100', wherein the initial structure 100' includes a substrate 110', a laminated structure 200' formed on the substrate, and capacitor units 150' formed in the laminated structure 200'. The laminated structure 200' includes dielectric layers 120' and support layers 130' that are alternately laminated on the substrate 110'.

Figure 29:
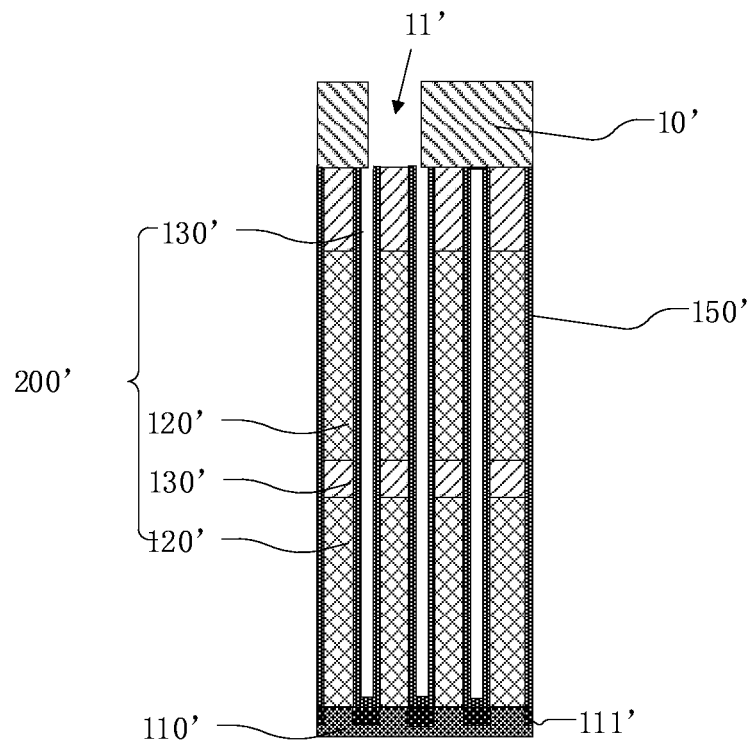
FIG. 29 is a schematic diagram of forming a mask layer on an initial structure in a method of manufacturing a semiconductor structure according to an exemplary comparative embodiment.

As shown in FIG. 29, a mask layer 10' is formed on a top surface of the initial structure 100'. A first pattern 11' is defined on the mask layer 10', and the first pattern 11' at least exposes partial top surface of each of the capacitor units 150'.

Figure 30:
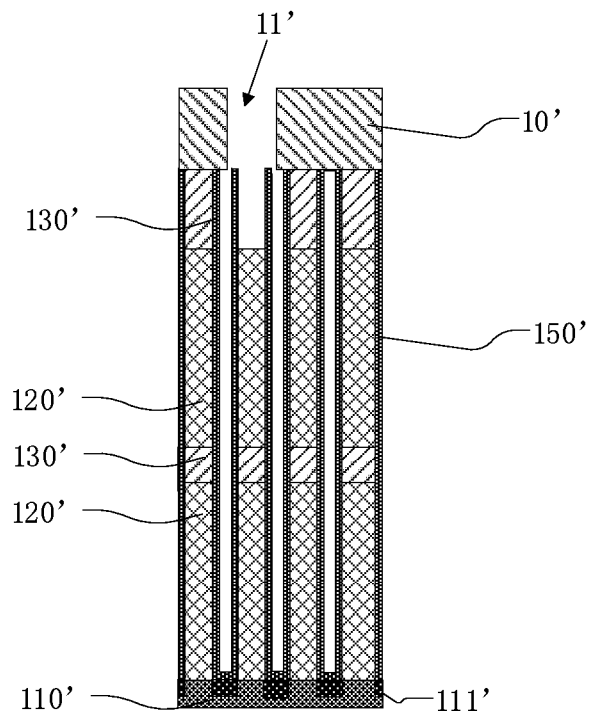
FIG. 30 is a schematic diagram of removing an upper support layer through etching according to a mask layer and forming a first opening on the upper support layer in a method of manufacturing a semiconductor structure according to an exemplary comparative embodiment.
Figure 31:
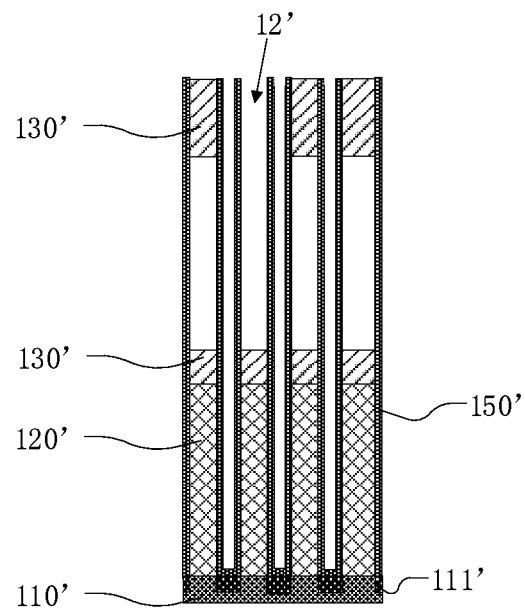
FIG. 31 is a schematic diagram of removing an upper dielectric layer in a method of manufacturing a semiconductor structure according to an exemplary comparative embodiment.

As shown in FIG. 30 with reference to FIG. 31, according to the first pattern 11', the support layer 130' corresponding to the first pattern 11' is removed by using a dry etching technology or a wet etching technology, to form a first opening 12' in the support layer 130', wherein the first opening 12' exposes the dielectric layer 120'.

As shown in FIG. 31, an acid solution is injected into the first opening 12' to remove all of the dielectric layer 120' by using a wet etching technology.

Figure 32:
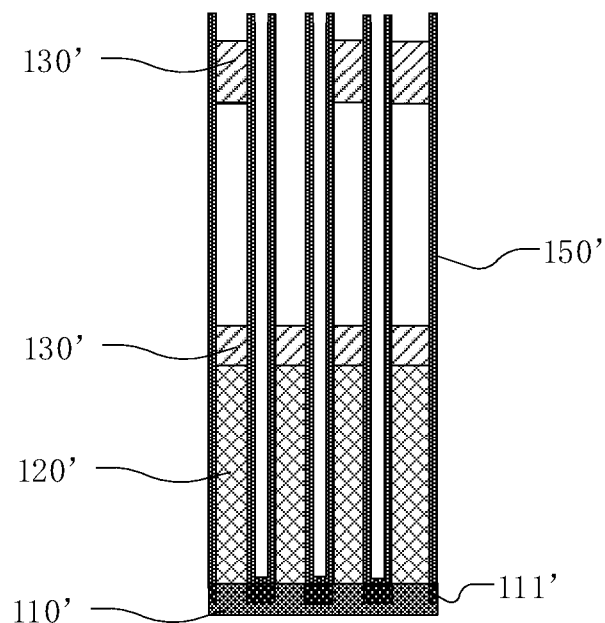
FIG. 32 is a schematic diagram of etching back an upper support layer in a method of manufacturing a semiconductor structure according to an exemplary comparative embodiment.
Figure 33:
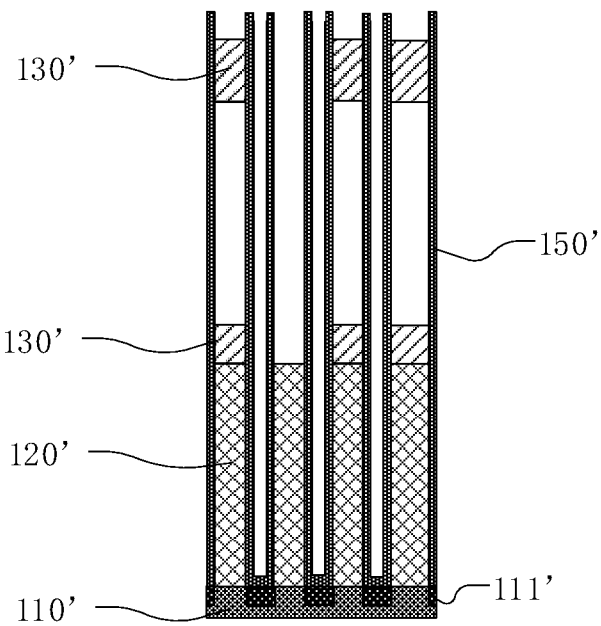
FIG. 33 is a schematic diagram of removing a lower support layer through etching according to a mask layer in a method of manufacturing a semiconductor structure according to an exemplary comparative embodiment.
Figure 34:
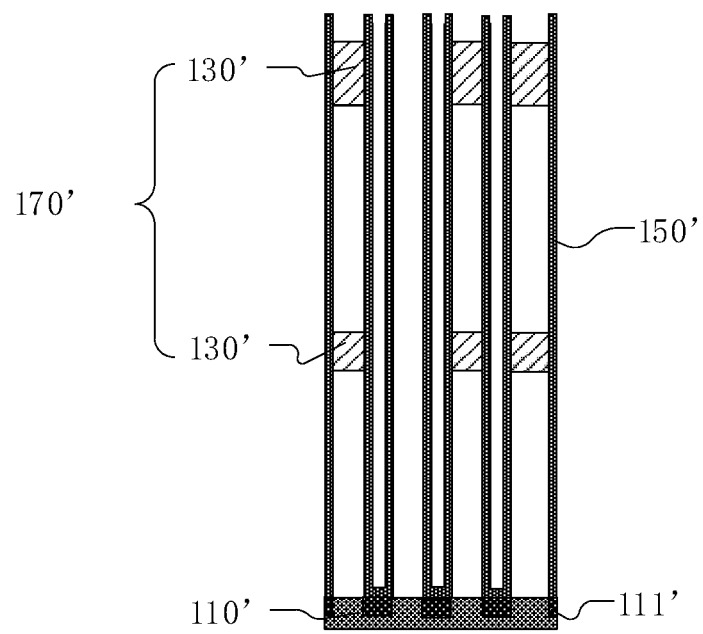
FIG. 34 is a schematic diagram of removing a lower dielectric layer in a method of manufacturing a semiconductor structure according to an exemplary comparative embodiment.

As shown in FIG. 32, the upper support layer 130' is etched back.

With reference to FIG. 30 to FIG. 34, when the initial structure 100' includes multiple support layers 130' and multiple dielectric layers 120', the upper support layer 130' and the upper dielectric layer 120' are removed. The foregoing step is repeated to remove the lower support layer 130' corresponding to the first pattern 11' and remove all of the lower dielectric layer 120', until the substrate 110' is exposed, thus forming the semiconductor structure, wherein a remaining part of the support layers 130' are used as a support structure 170'.

Figure 35:
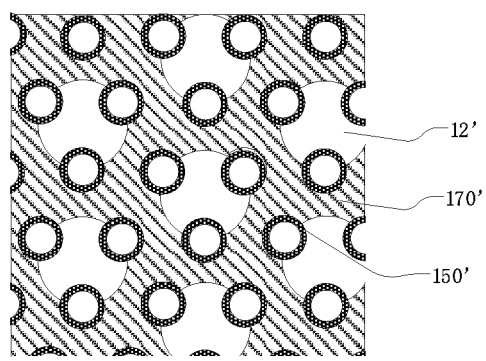
FIG. 35 is a top view of FIG. 34.

In the formed semiconductor structure in the related art, as shown in FIG. 35, the support structure 170' is connected to partial sidewalls of all the capacitor units 150', and the support structure 170' occupies a large upper space in the semiconductor structure.

Figure 1:
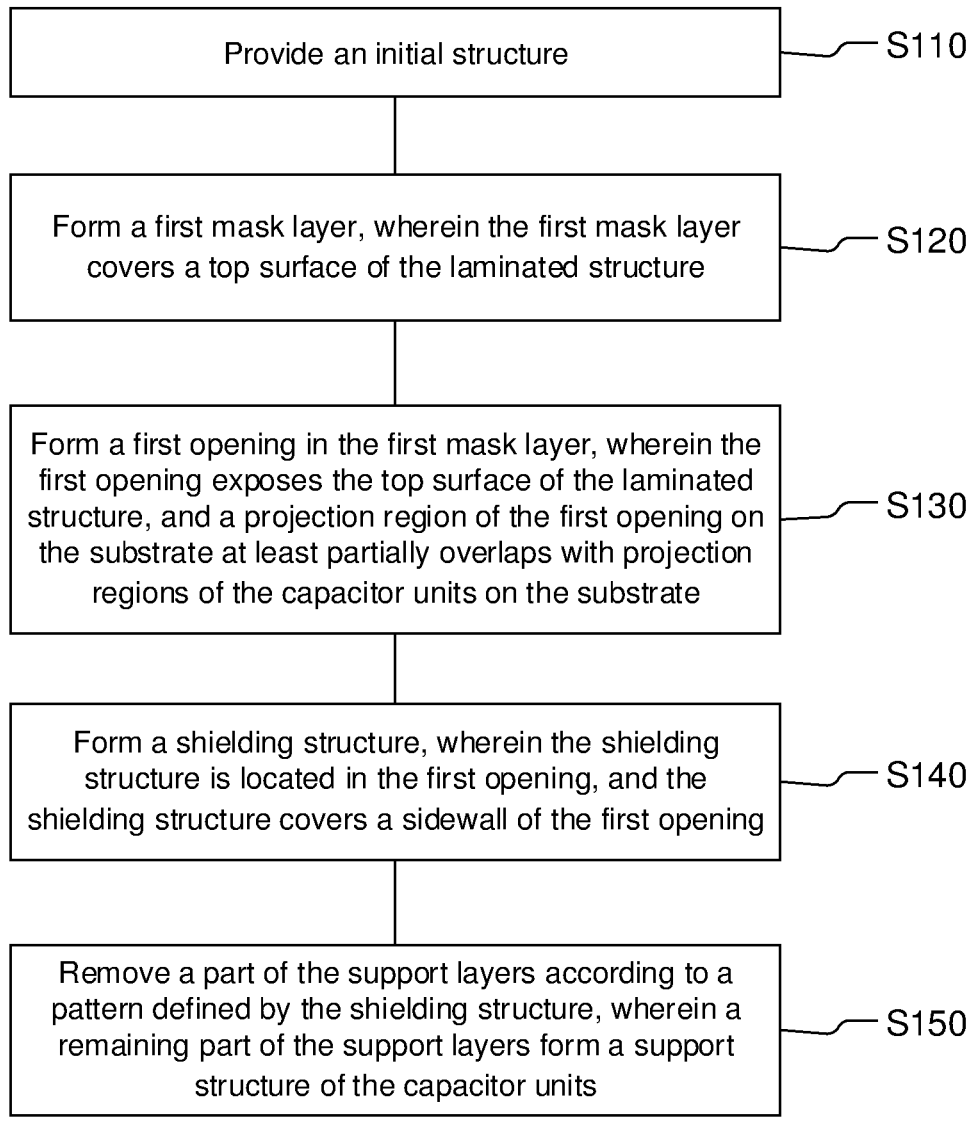
FIG. 1 is a flowchart of a method of manufacturing a semiconductor structure according to an exemplary embodiment.

Accordingly, an embodiment of the present disclosure provides a method of manufacturing a semiconductor structure, as shown in FIG. 1. FIG. 1 shows a flowchart of a method of manufacturing a semiconductor structure according to an exemplary embodiment of the present disclosure. FIG. 9 to FIG. 24 are schematic diagrams of various stages of the method of manufacturing a semiconductor structure. The method of manufacturing a semiconductor structure is described below with reference to FIG. 9 to FIG. 24.

The semiconductor structure is not limited in this embodiment. The semiconductor structure is described below by taking a dynamic random access memory (DRAM) as an example, but this embodiment is not limited to this, and the semiconductor structure in this embodiment may also be other structure.

As shown in FIG. 1, an exemplary embodiment of the present disclosure provides a method of manufacturing a semiconductor structure. The manufacturing method includes:

S110: Provide an initial structure.

The initial structure includes a substrate, a laminated structure formed on the substrate, and capacitor units formed in the laminated structure, and the laminated structure includes support layers.

Figure 9:
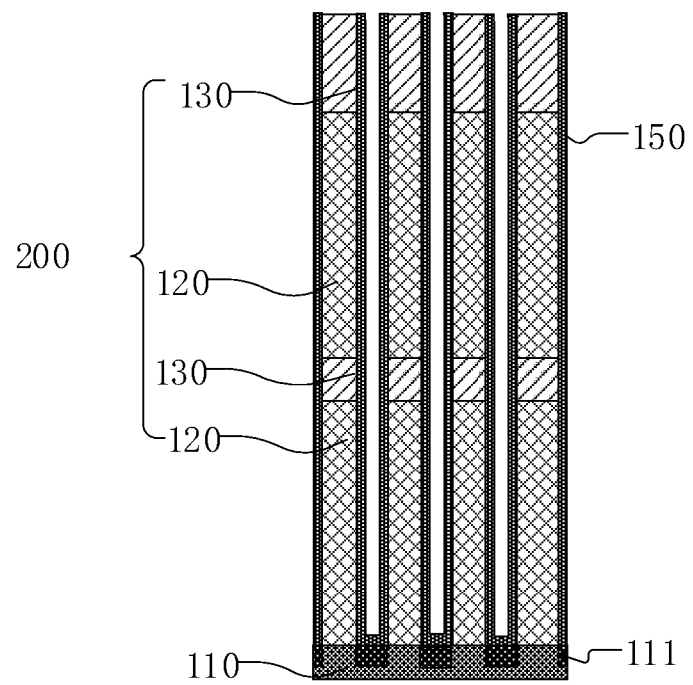
FIG. 9 is a schematic diagram of forming capacitor units in a method of manufacturing a semiconductor structure according to an exemplary embodiment.
Figure 11:
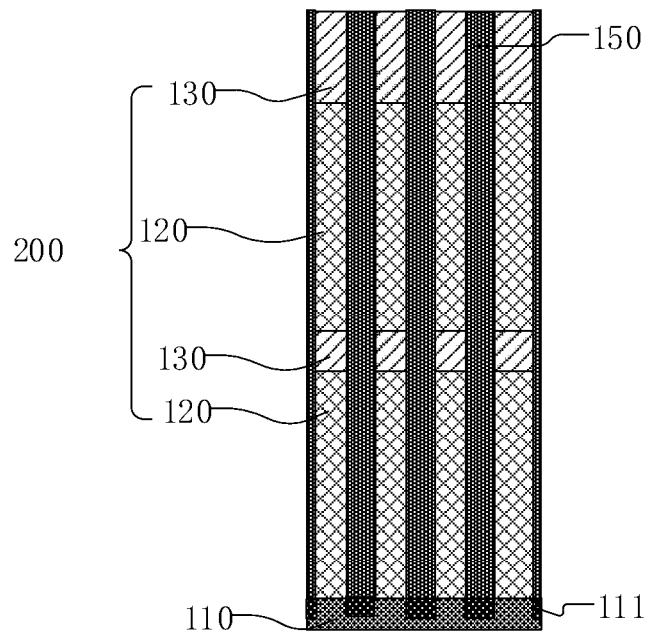
FIG. 11 is a schematic diagram of forming capacitor units in a method of manufacturing a semiconductor structure according to an exemplary embodiment.

As shown in FIG. 9 or FIG. 11, the initial structure 100 may include multiple capacitor units 150 arranged independent of each other. The multiple capacitor units 150 are provided in the laminated structure 200 and spaced apart by the laminated structure 200. The capacitor units 150 are electrically connected to capacitor contact regions 111 in the substrate 110, and top surfaces of the capacitor units 150 are flush with a top surface of the laminated structure 200.

As shown in FIG. 9 or FIG. 11, the laminated structure 200 includes dielectric layers 120 and support layers 130 that are arranged alternately. The specific number of laminated layers and the laminated height of the dielectric layers 120 and the support layers 130 in the laminated structure are set according to the height of the capacitors units 150.

The material of the dielectric layer 120 includes silicon oxide or boro-phospho-silicate glass (BPSG). The material of the dielectric layer 120 may be doped with boron or phosphorus.

The material of the support layer 130 includes any one or a combination of any two or more of silicon nitride, silicon oxynitride, or silicon carbon nitride.

S120: Form a first mask layer, wherein the first mask layer covers a top surface of the laminated structure.

Figure 12:
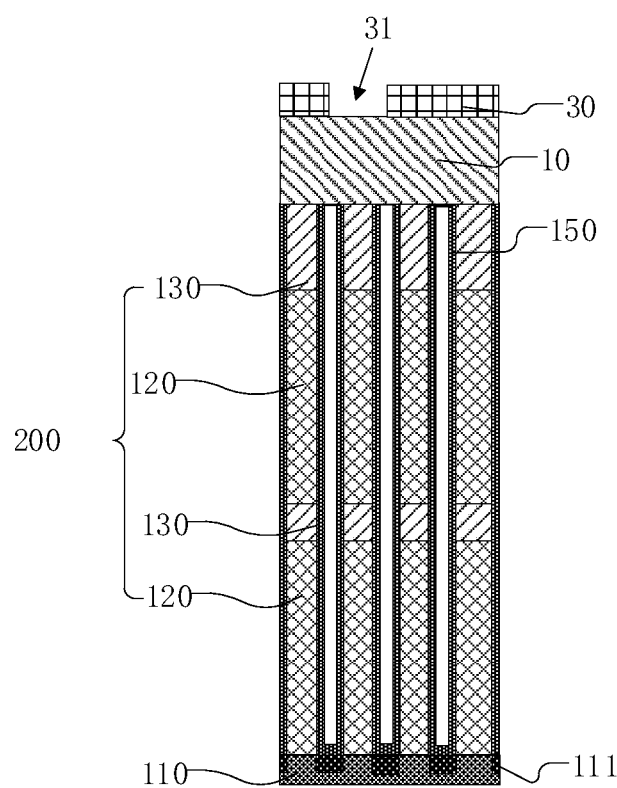
FIG. 12 is a schematic diagram of forming a photoresist mask layer on a first mask layer in a method of manufacturing a semiconductor structure according to an exemplary embodiment.

As shown in FIG. 12, the first mask layer 10 can be a single-layer or double-layer structure, and the material of the first mask layer 10 can be polysilicon, silicon nitride, silicon oxide, etc. For example, when the first mask layer 10 is a single-layer structure, the material of the first mask layer 10 is polysilicon; if the first mask layer 10 is a double-layer structure, the material of the bottom layer of the first mask layer 10 is polysilicon and the material of the top layer is silicon nitride.

S130: Form a first opening in the first mask layer, wherein the first opening exposes the top surface of the laminated structure, and a projection region of the first opening on the substrate at least partially overlaps with projection regions of the capacitor units on the substrate.

Figure 13:
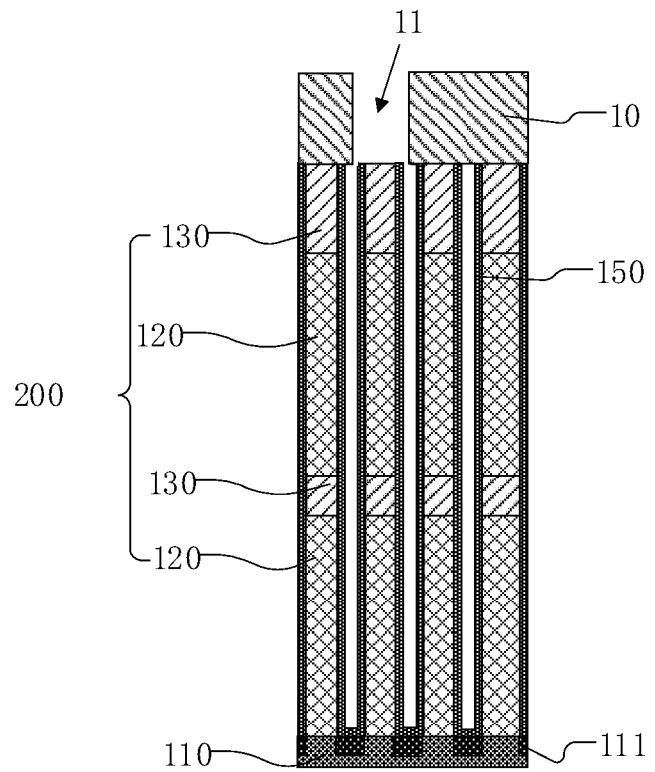
FIG. 13 is a schematic diagram of removing a first mask layer to form a first opening in a method of manufacturing a semiconductor structure according to an exemplary embodiment.
Figure 14:
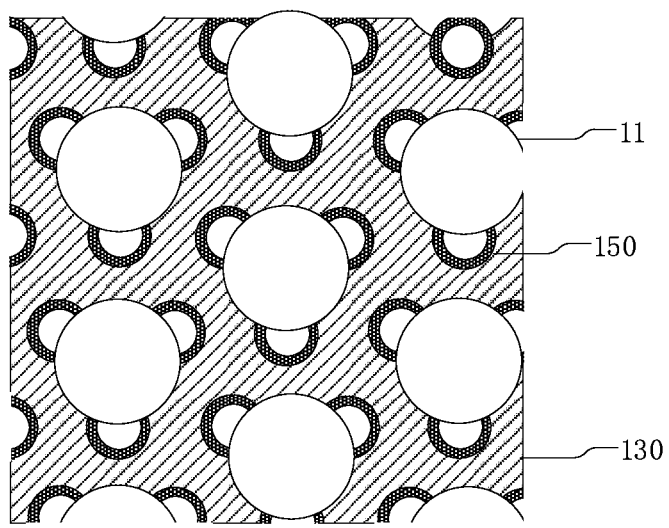
FIG. 14 is a diagram of projection of a first opening on a top surface of an initial structure in a method of manufacturing a semiconductor structure according to an exemplary embodiment.

As shown in FIG. 13 and FIG. 14, the first opening 11 is defined according to the number and location distribution of the capacitor units 150 in the initial structure 100. For example, the first opening 11 is defined by using two capacitor units 150, three capacitor units 150, four capacitor units 150 or five capacitor units 150 as a group. The projection region of the first opening 11 on the substrate 110 at least partially overlaps with the projection region of each capacitor unit 150 in one group of capacitor units 150 on the substrate 110.

S140: Form a shielding structure, wherein the shielding structure is located in the first opening, and the shielding structure covers a sidewall of the first opening.

Figure 16:
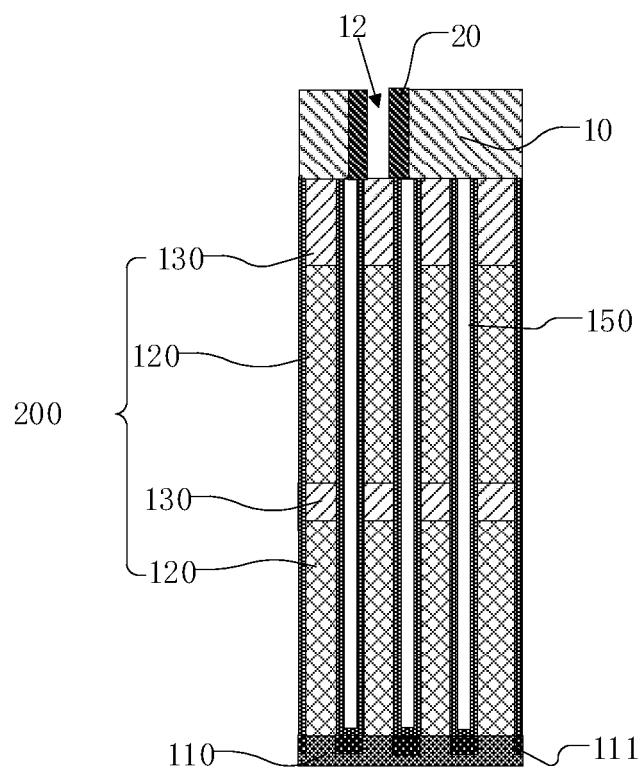
FIG. 16 is a schematic diagram, along a BL direction, of forming a second initial dielectric unit in a method of manufacturing a semiconductor structure according to an exemplary embodiment.

As shown in FIG. 16, the shielding structure 20 may be deposited on a sidewall of the first opening 11. The shielding structure 20 covers the sidewall of the first opening 11. The shielding structure 20 and an exposed bottom wall of the first opening 11 define a second opening 12. For example, the material of the shielding structure 20 may be silicon dioxide. In other embodiments, the shielding structure 20 may be made of any other suitable materials.

S150: Remove a part of the support layers according to a pattern defined by the shielding structure, wherein a remaining part of the support layers form a support structure of the capacitor units.

Figure 21:
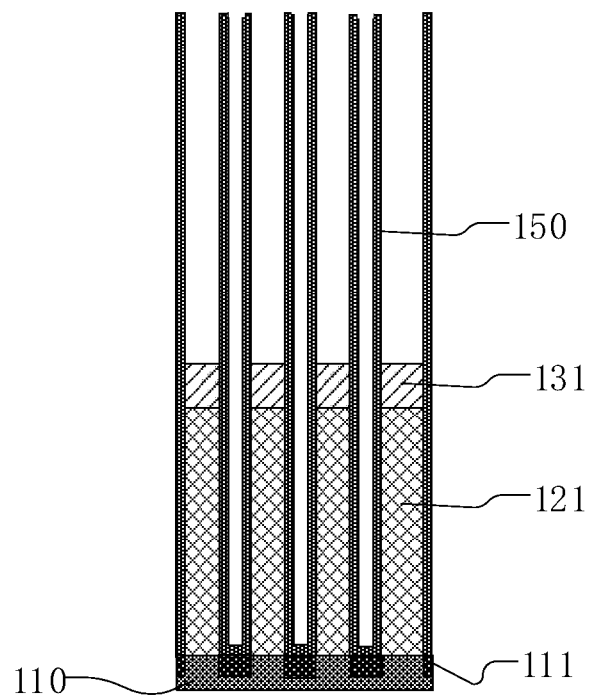
FIG. 21 is a schematic diagram of removing a second dielectric layer in a method of manufacturing a semiconductor structure according to an exemplary embodiment.
Figure 22:
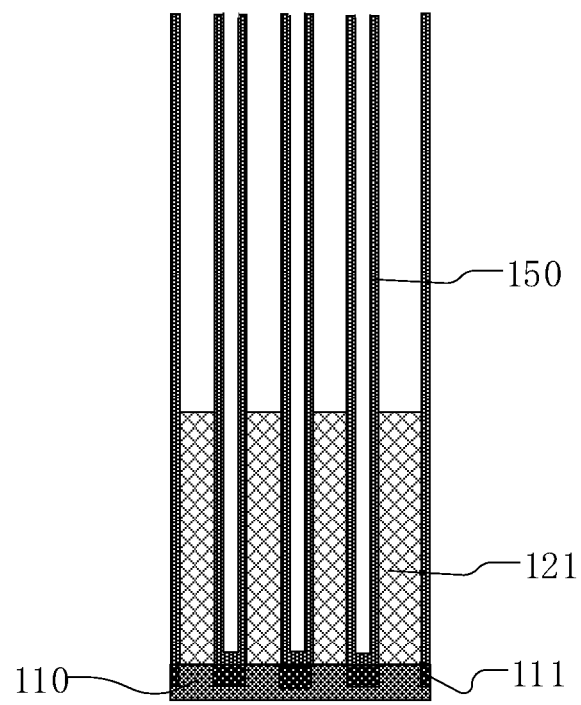
FIG. 22 is a schematic diagram of removing a first support layer according to a shielding structure in a method of manufacturing a semiconductor structure according to an exemplary embodiment.
Figure 23:
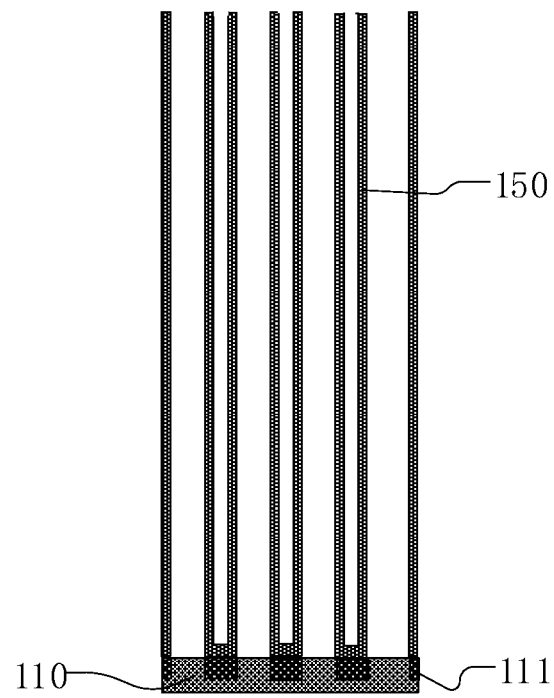
FIG. 23 is a schematic diagram of removing a first dielectric layer in a method of manufacturing a semiconductor structure according to an exemplary embodiment.

As shown in FIG. 23 with reference to FIG. 16, FIG. 17, FIG. 19, FIG. 21, and FIG. 22, the support layer 130 exposed by the second opening 12 can be removed through dry etching or wet etching, and at the same time, all the support layers 130 shielded by the first mask layer 10 is removed. Only the support layers 130 shielded by the shielding structure 20 are used as a support structure 170 for the capacitor units 150 (referring to FIG. 24).

In the semiconductor structure formed in this embodiment, only part of the support layers covered by the shielding structure is retained as the support structure, reducing the space occupied by the support structure in the semiconductor structure and increasing the available space in the semiconductor without increasing the size of the semiconductor.

An exemplary embodiment of the present disclosure provides a method of manufacturing a semiconductor structure. This embodiment describes the implementation of step S130 in the foregoing embodiment.

Figure 2:
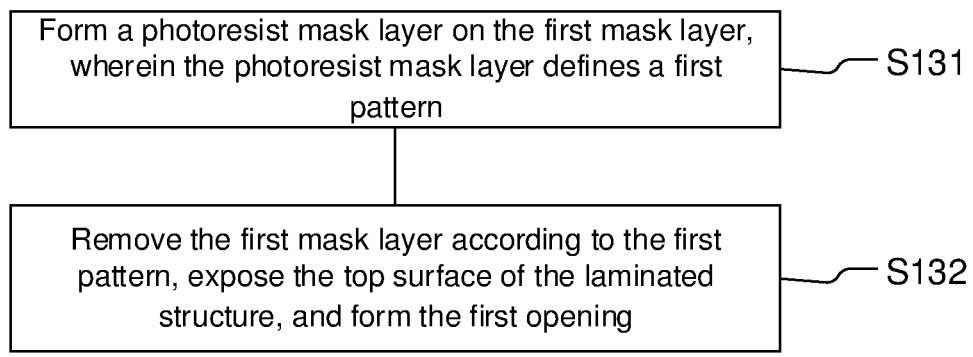
FIG. 2 is a flowchart of forming a first opening in a first mask layer in a method of manufacturing a semiconductor structure according to an exemplary embodiment.

As shown in FIG. 2, in the method of manufacturing a semiconductor structure provided in an exemplary embodiment of the present disclosure, the forming a first opening in the first mask layer, wherein the first opening exposes the top surface of the laminated structure includes:

S131: Form a photoresist mask layer on the first mask layer, wherein the photoresist mask layer defines a first pattern.

As shown in FIG. 12, a first pattern 31 is defined on the photoresist mask layer 30 according to the number and location distribution of the capacitor units 150 in the initial structure. When the first pattern 31 is defined, two capacitor units 150, three capacitor units 150, four capacitor units 150 or five capacitor units 150 may be used as one group of capacitor units 150. Projection of the first pattern 31 on the top surface of the initial structure 100 covers at least partial top surface of each capacitor unit 150 in each group of capacitor units 150.

S132: Remove the first mask layer according to the first pattern to expose the top surface of the laminated structure, to form the first opening.

As shown FIG. 13 with reference to FIG. 12, according to the first pattern 31, the first mask layer 10 is etched by using dry etching or wet etching, until the top surface of the initial structure 100 is exposed, thus forming the first opening 11. The first opening 11 transfers the first pattern 31 to the top surface of the initial structure 100, to expose at least partial top surface of each capacitor unit 150 in each group of capacitor units 150 and partial top surface of the laminated structure 200.

Figure 24:
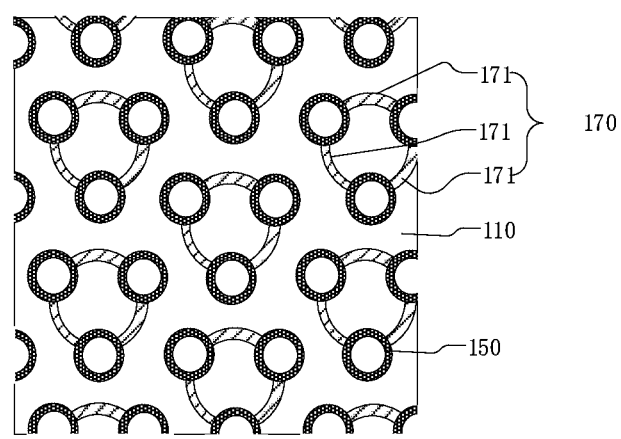
FIG. 24 is a top view of FIG. 23.

In some embodiments of the present disclosure, as shown in FIG. 14 with reference to FIG. 24, a projection region of the first opening 11 on the substrate 110 partially overlaps with each of multiple projection regions of multiple capacitor units 150 on the substrate 110. Two, three, four or five capacitor units 150 may be taken as a group, such that the support structure 170 formed according to the first opening 11 connects each group of capacitor units into a whole. The support structure 170 includes multiple support units 171 (the number of support units is equal to the number of capacitor units in each group of capacitor units), and each support unit 171 connects two adjacent capacitor units 150. The projection region of the first opening 11 on the substrate 110 overlaps with the projection region of each capacitor unit 150 in one group of capacitor units on the substrate 110 by an equal area, and the support structure 170 provides equal support to each capacitor unit 150, such that the multiple capacitor units 150 connected by the support structure 170 have better anti-tipping performance.

As shown in FIG. 14 with reference to FIG. 24, the projection region of the first opening 11 on the substrate 110 is circular; the support structure 170 formed according to the shielding structure 20 includes multiple arc support units 171, and the arc structure has better impact resistance. The projection of the first opening 11 on the substrate 110 may also be oval or in other shapes.

As shown in FIG. 14 with reference to FIG. 24, three capacitor units 150 are used as one group. The line connecting the center points of the three capacitor units 150 in each group is an equilateral triangle, and the equilateral triangle is an inscribed triangle of the circle formed by the projection of the first opening 11 on the substrate 110. The projection region of the first opening 11 on the substrate 110 partially overlaps with the projection region of each of the three capacitor units 150 on the substrate 110 by the same area. The support structure 170 formed in this embodiment includes three support units 171 with equal radian, and the three capacitor units 150 are connected by the three support units 171 to form a whole, such that the capacitor units 150 are supported to prevent the capacitor units 150 from tipping over.

In other embodiments of the present disclosure, the projection region of the first opening 11 on the substrate 110 covers multiple projection regions of multiple capacitor units 150 on the substrate.

Figure 25:
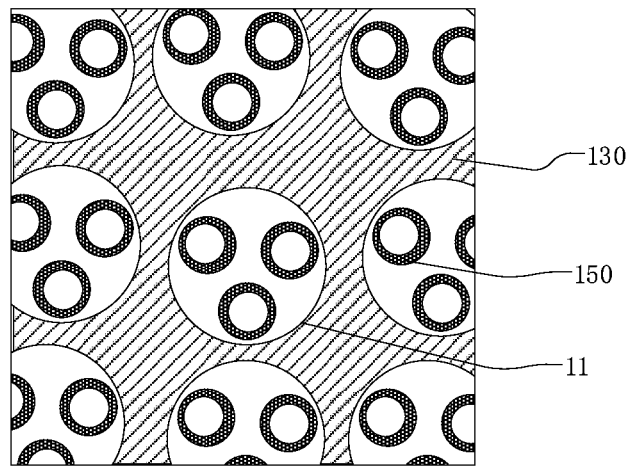
FIG. 25 is a diagram of projection of a first opening on a top surface an initial structure in a method of manufacturing a semiconductor structure according to an exemplary embodiment.

As shown in FIG. 25, by using two, three, four or five capacitor units 150 as one group, the projection region of the first opening 11 on the substrate 110 covers all the projection regions of the multiple capacitor units 150 in each group of capacitor units on the substrate 110.

Figure 26:
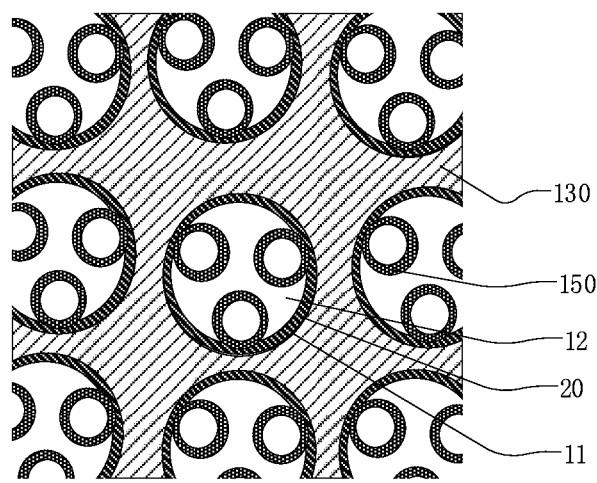
FIG. 26 is a diagram of projection of a shielding structure on a top surface of an initial structure in a method of manufacturing a semiconductor structure according to an exemplary embodiment.

As shown in FIG. 26, a shielding structure 20 is formed on a sidewall of the first opening 11. The shielding structure 20 and the exposed bottom wall of the first opening 11 form a second opening 12. A projection region of the second opening 12 on the substrate 110 partially overlaps with each of multiple projection regions of the multiple capacitor units 150 in each group of capacitor units on the substrate 110. The projection region of the second opening 12 on the substrate 110 partially overlapping with each of multiple projection regions of the multiple capacitor units 150 in each group of capacitor units on the substrate 110 may indicate that the projection region of the second opening 12 on the substrate 110 partially covers the multiple projection regions of the multiple capacitor units 150 on the substrate 110; alternatively, the edge of the projection region of the second opening 12 on the substrate 110 overlaps with the edges of the multiple projection regions of the multiple capacitor units 150 on the substrate 110; or the multiple projection regions of the multiple capacitor units 150 on the substrate 110 are inscribed patterns of the projection region of the second opening 12 on the substrate 110, to ensure that the formed support structure 170 surrounds multiple capacitor units 150 and is partially connected to a sidewall of each capacitor unit 150, thus connecting the multiple capacitor units 150 into a whole.

Figure 27:
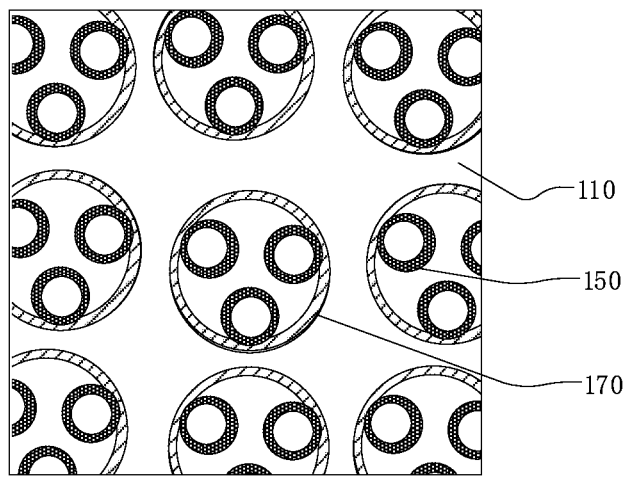
FIG. 27 is a top view of a semiconductor structure formed according to the shielding structure shown in FIG. 26.

As shown in FIG. 27, the support structure 170 formed according to the shielding structure 20 is partially connected to the sidewall of each of the multiple capacitor units 150 in a group. The support structure 170 can connect a group of capacitor units 150 into a whole. The support structure 170 supports the capacitor units 150 and prevents the capacitor units 150 from tipping over.

An exemplary embodiment of the present disclosure provides a method of manufacturing a semiconductor structure. This embodiment describes the implementation of step S140 in the foregoing embodiment.

In step S140 in the method of manufacturing a semiconductor structure provided by this embodiment, a method for forming the shielding structure includes: depositing a shielding material on a sidewall of the first opening along a thickness direction of the first mask layer, to obtain the shielding structure.

Figure 15:
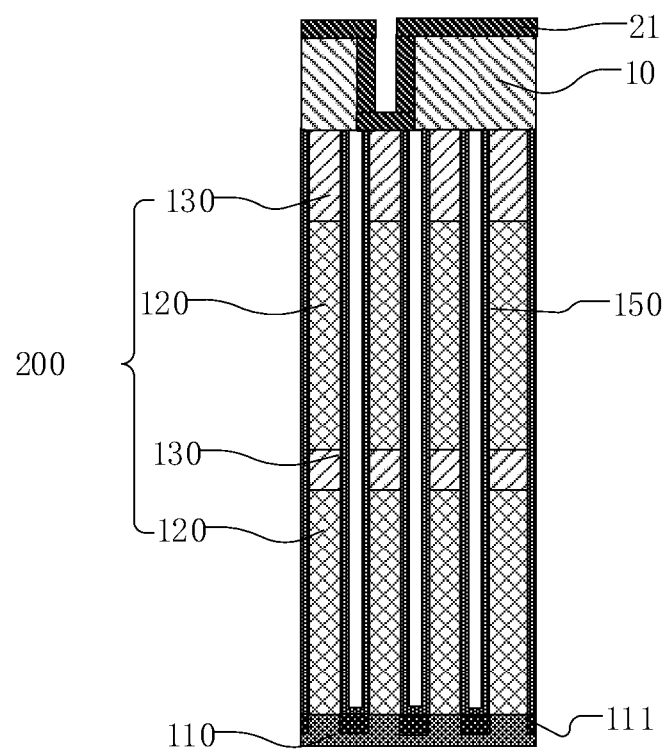
FIG. 15 is a schematic diagram, along a BL direction, of forming a second initial dielectric unit in a method of manufacturing a semiconductor structure according to an exemplary embodiment.

As shown in FIG. 15 and FIG. 16 with reference to FIG. 13, a shielding material layer 21 may be deposited by using atomic layer deposition (ALD). The shielding material layer 21 covers the sidewall and bottom wall of the first opening 11 and the top surface of the first mask layer 10. The shielding material layer 21 on the bottom wall of the first opening 11 and the shielding material layer 21 on the top surface of the first mask layer 10 is removed through dry etching or wet etching, and the shielding material layer 21 covering the sidewall of the first opening 11 is used as the shielding structure.

The shielding structure 20 formed in this embodiment shields partial top surface of the initial structure 100. The shielding structure 20 shields the top surfaces of the capacitor units 150 and the top surface of the laminated structure 200, such that the support structure 170 formed according to the shielding structure 20 is connected to the sidewalls of the capacitor units 150, the capacitor units 150 can be sufficiently supported.

Figure 3:
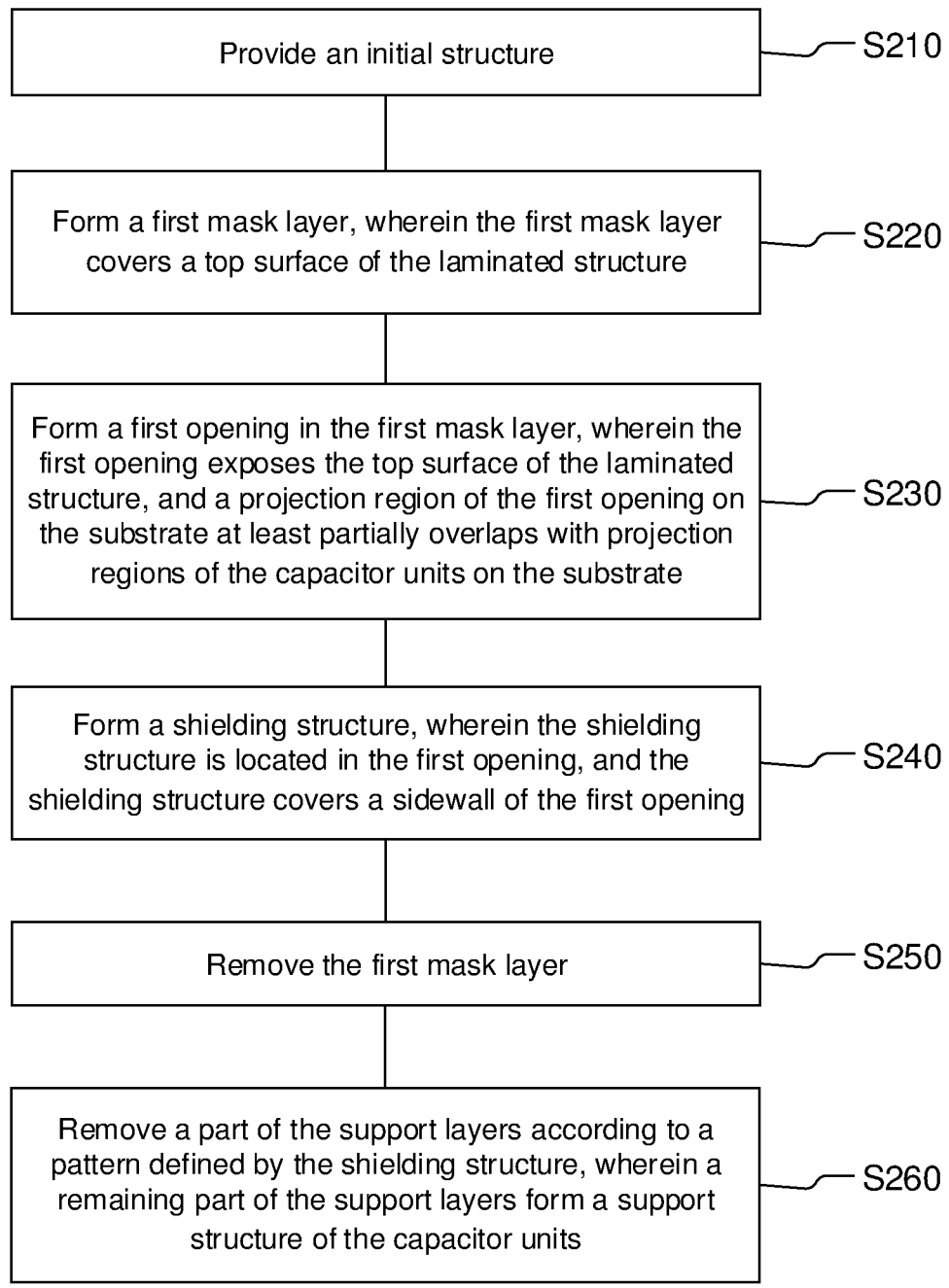
FIG. 3 is a flowchart of a method of manufacturing a semiconductor structure according to an exemplary embodiment.

An exemplary embodiment of the present disclosure provides a method of manufacturing a semiconductor structure, as shown in FIG. 3. FIG. 3 shows a flowchart of a method of manufacturing a semiconductor structure according to an exemplary embodiment of the present disclosure. FIG. 9 to FIG. 24 are schematic diagrams of various stages of the method of manufacturing a semiconductor structure. The method of manufacturing a semiconductor structure is described below with reference to FIG. 9 to FIG. 24.

As shown in FIG. 3, an exemplary embodiment of the present disclosure provides a method of manufacturing a semiconductor structure. The manufacturing method includes:

S210: Provide an initial structure.

The initial structure includes a substrate, a laminated structure formed on the substrate, and capacitor units formed in the laminated structure, and the laminated structure includes support layers.

S220: Form a first mask layer, wherein the first mask layer covers a top surface of the laminated structure.

S230: Form a first opening in the first mask layer, wherein the first opening exposes the top surface of the laminated structure, and a projection region of the first opening on the substrate at least partially overlaps with projection regions of the capacitor units on the substrate.

S240: Form a shielding structure, wherein the shielding structure is located in the first opening, and the shielding structure covers a sidewall of the first opening.

S250: Remove the first mask layer.

S260: Remove a part of the support layers according to a pattern defined by the shielding structure, wherein a remaining part of the support layers form a support structure of the capacitor units.

Figure 17:
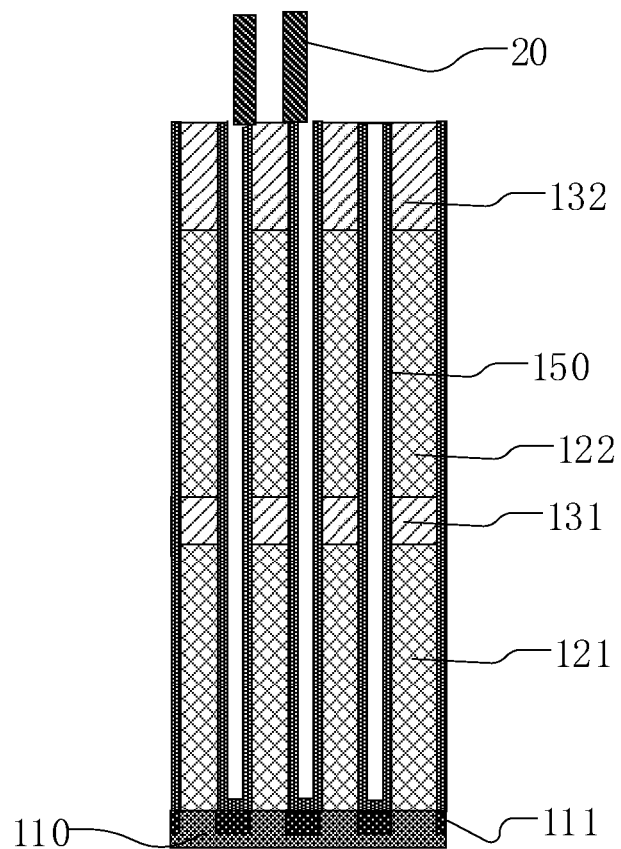
FIG. 17 is a schematic diagram of forming a shielding structure in a method of manufacturing a semiconductor structure according to an exemplary embodiment.
Figure 18:
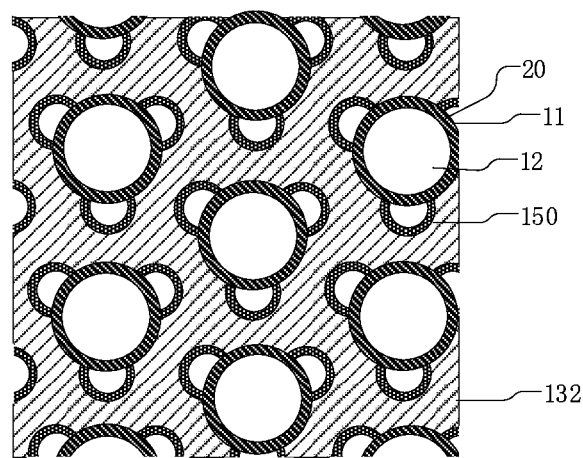
FIG. 18 is a diagram of projection of a shielding structure on a top surface of an initial structure in a method of manufacturing a semiconductor structure according to an exemplary embodiment.

As shown in FIG. 17 with reference to FIG. 18, the first mask layer 10 may be removed by dry etching or wet etching. The first mask layer 10 and the shielding structure 20 may be made of different materials. When the first mask layer is removed by etching, the shielding structure 20 is retained.

The first mask layer 10 is removed to expose the top surface of the initial structure 100 which is shielded by the first mask layer 10, such that the support layer 130 originally shielded by the first mask layer 10 is completely removed, and only the part of the support layers 130 shielded by the shielding structure 20 is used as the support structure 170, thus reducing the space occupied by the support structure 170.

Figure 4:
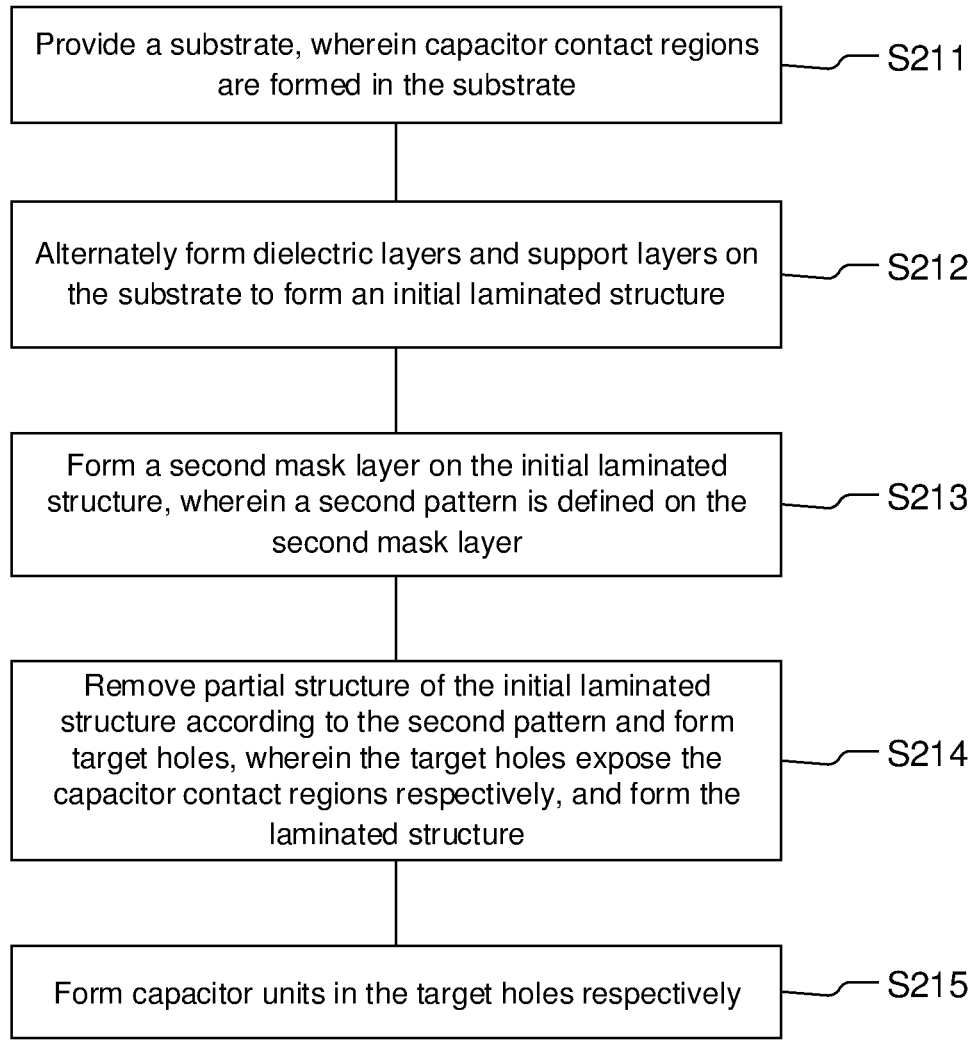
FIG. 4 is a flowchart of a method of manufacturing a semiconductor structure according to an exemplary embodiment.

An exemplary embodiment of the present disclosure describes step S210 in the foregoing embodiment. FIG. 4 shows an implementation flowchart of step S210 in a method of manufacturing a semiconductor structure to an exemplary embodiment of the present disclosure. As shown in FIG. 4, in the method of manufacturing a semiconductor structure, the providing an initial structure includes:

S211: Provide a substrate, wherein capacitor contact regions are formed in the substrate.

Figure 5:
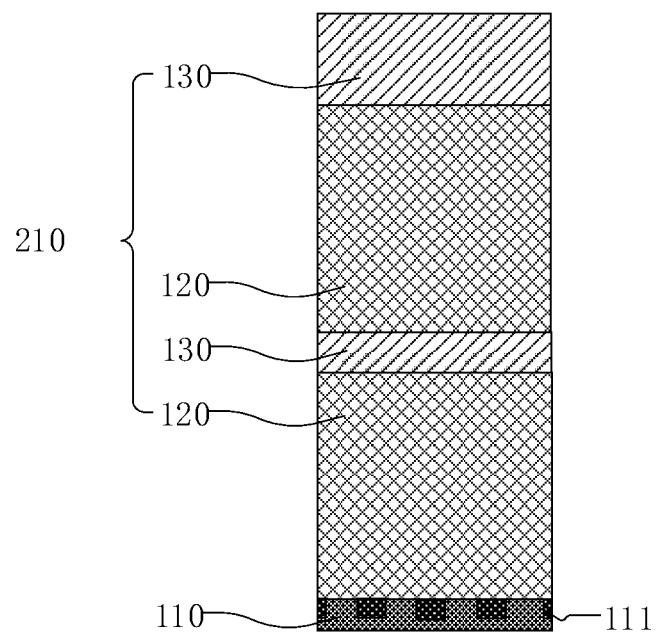
FIG. 5 is a schematic diagram of forming an initial laminated structure on a substrate in a method of manufacturing a semiconductor structure according to an exemplary embodiment.

Referring to FIG. 5, the substrate 110 is a semiconductor substrate, and includes a silicon-containing substance. The substrate 110 may include a silicon substrate, a silicon-germanium substrate or a silicon on insulator (SOI) substrate. The capacitor contact regions 111 are provided in the substrate 110.

S212: Alternately form dielectric layers and support layers on the substrate and form an initial laminated structure.

As shown in FIG. 5, the dielectric layer 120 can be deposited on the substrate through atomic layer deposition (ALD). The support layer 130 can be deposited on the substrate through atomic layer deposition (ALD).

According to the height of the capacitor unit, the depositing the dielectric layer and depositing the support layer on the substrate is repeated, and form an initial laminated structure 210. The top layer of the initial laminated structure 210 may be the support layer 130 or the dielectric layer 120.

S213: Form a second mask layer on the initial laminated structure, wherein a second pattern is defined on the second mask layer.

Figure 6:
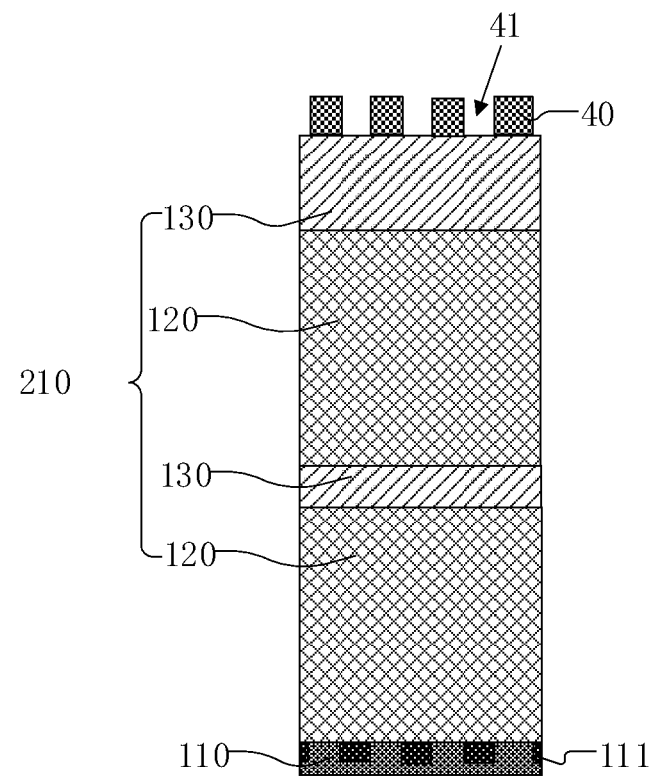
FIG. 6 is a schematic diagram of forming a second mask layer on an initial laminated structure in a method of manufacturing a semiconductor structure according to an exemplary embodiment.

As shown in FIG. 6, a second mask layer 40 is formed on the initial laminated structure 210. A second pattern 41 is defined on the second mask layer 40. The second pattern 41 is provided corresponding to the positions of the capacitor contact regions 111 of the substrate 110. The second pattern 41 exposes partial top surface of the initial laminated structure 210.

S214: Remove partial structure of the initial laminated structure according to the second pattern and form target holes, wherein the target holes expose the capacitor contact regions respectively, and from the laminated structure.

Figure 7:
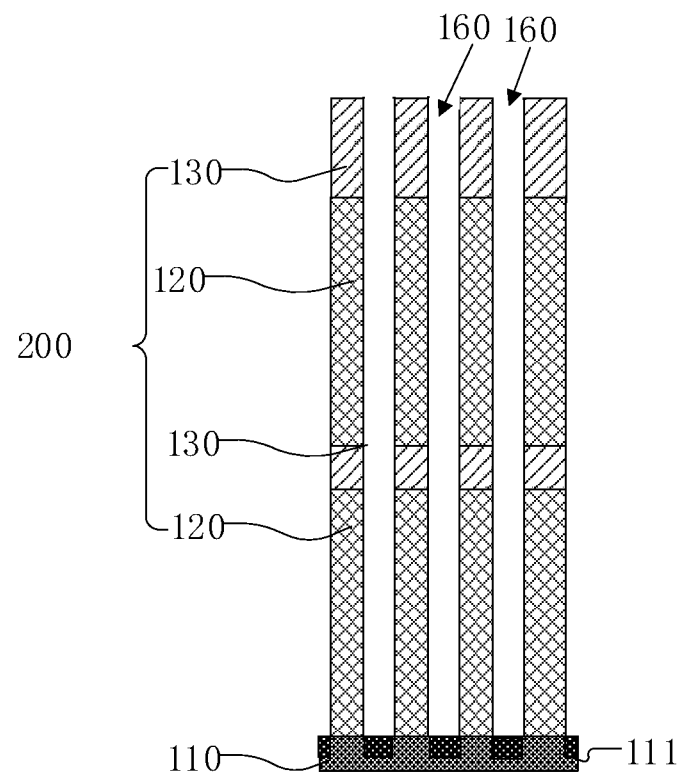
FIG. 7 is a schematic diagram of forming target holes in an initial laminated structure in a method of manufacturing a semiconductor structure according to an exemplary embodiment.

As shown in FIG. 7 with reference to FIG. 6, part of the initial laminated structure 210 corresponding to the second pattern 41 is removed through etching according to the second mask layer 40, to expose the capacitor contact regions 111, and then etching is stopped to form the target holes 160. A remaining part of the initial laminated structure 210 is used as the laminated structure 200.

S215: Form capacitor units in the target holes respectively.

As shown in FIG. 9 or FIG. 11, the capacitor units 150 can be deposited in the target holes 160 respectively by using atomic layer deposition (ALD). The capacitor units 150 are connected to the capacitor contact regions 111 respectively, and the top surfaces of the capacitor units 150 are flush with the top surface of the laminated structure 200.

In this embodiment, a plurality of capacitor contact regions 111 are arranged in the substrate 110. The capacitor contact regions 111 are uniformly arranged in the substrate 110 in an array. The capacitor units 150 formed according to the capacitor contact regions 111 are uniformly arranged in an array, such that the forming process of the support structure 170 is simpler.

In some embodiments of the present disclosure, the forming capacitor units in the target holes respectively includes: providing an electrode material, wherein the electrode material at least covers a bottom wall and a sidewall of each of the target holes.

Figure 8:
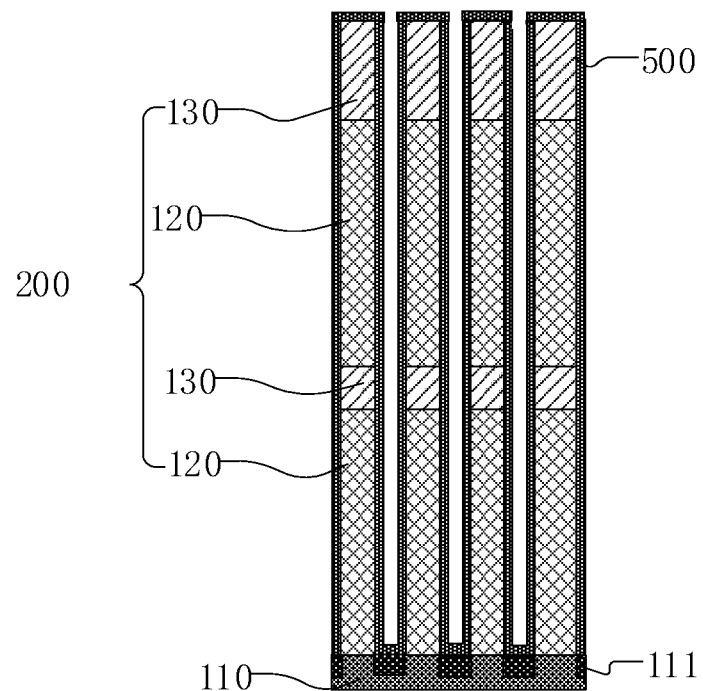
FIG. 8 is a schematic diagram of depositing an electrode material in a method of manufacturing a semiconductor structure according to an exemplary embodiment.

As shown in FIG. 8 with reference to FIG. 7, an electrode material 500 may be deposited first through atomic layer deposition (ALD). The electrode material 500 covers the bottom wall and sidewall of each of the target holes 160, and the top surface of the laminated structure 200. As shown in FIG. 9, the electrode material 500 located on the top surface of the laminated structure 200 is then removed through dry etching, and the electrode material 500 located on the sidewall and bottom of each of the target holes 160 is used as the capacitor unit 150. The electrode material 500 includes a compound formed from one or both of a metal nitride and a metal silicide, such as titanium nitride, titanium silicide, nickel silicide, $TiSi_xN_y$, etc.

In other embodiments of the present disclosure, the forming capacitor units in the target holes respectively includes: providing an electrode material, wherein the electrode material fills the target holes.

Figure 10:
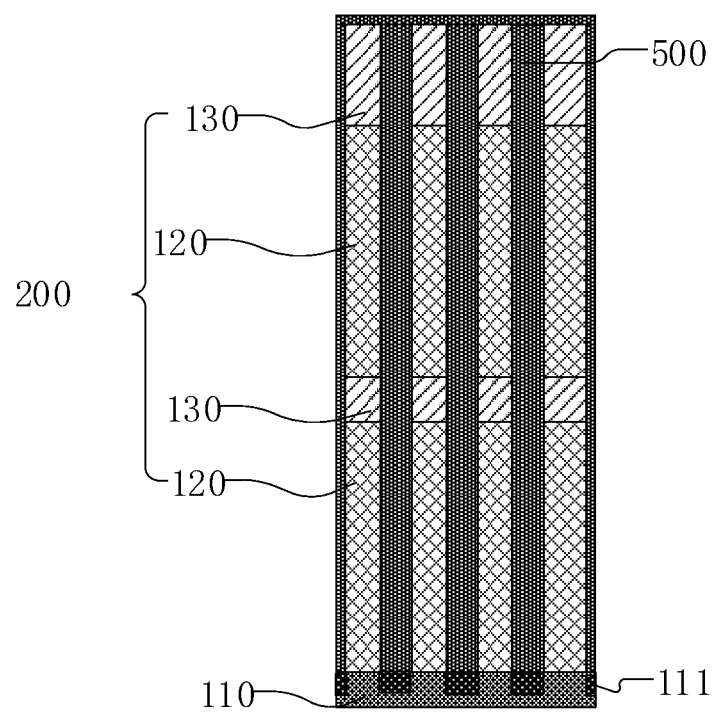
FIG. 10 is a schematic diagram of depositing an electrode material in a method of manufacturing a semiconductor structure according to an exemplary embodiment.

As shown in FIG. 10 with reference to FIG. 7, the electrode material 500 can be deposited through atomic layer deposition (ALD). The electrode material 500 fills the target holes 160 and covers the top surface of the laminated structure 200. As shown in FIG. 11, the electrode material 500 located on the top surface of the laminated structure 200 is removed by dry etching, and the electrode material 500 in each of the target holes 160 is retained as a capacitor unit 150.

In the initial structure 100 provided by this embodiment, the capacitor unit 150 can be a cup-shaped structure covering the sidewalls of the target hole 160 or a columnar structure filling the target hole 160. Capacitor units 150 of different shapes can be connected and supported by the support structure 170 to increase the available space in the semiconductor structure.

An exemplary embodiment of the present disclosure describes step S260 in the foregoing embodiment. In the method of manufacturing a semiconductor structure provided by this embodiment, step S260 of removing a part of the support layers according to a pattern defined by the shielding structure, wherein a remaining part of the support layers form a support structure of the capacitor units: sequentially removing the dielectric layers, and the support layers not covered by the pattern defined by the shielding structure to form the support structure.

As shown in FIG. 24 with reference to FIG. 16, in this embodiment, only part of the support layers 130 shielded by the shielding structure 20 is retained, and a larger opening is formed on the laminated structure 200, such that a larger operation opening is provided for the subsequent process operations of removing the laminated structure 200 and depositing the dielectric material in the semiconductor structure.

In this embodiment, as shown in FIG. 17, the laminated structure 200 includes a first dielectric layer 121, a first support layer 131, a second dielectric layer 122, and a second support layer 132 that are sequentially arranged along a direction of moving away from the substrate 110.

Figure 19:
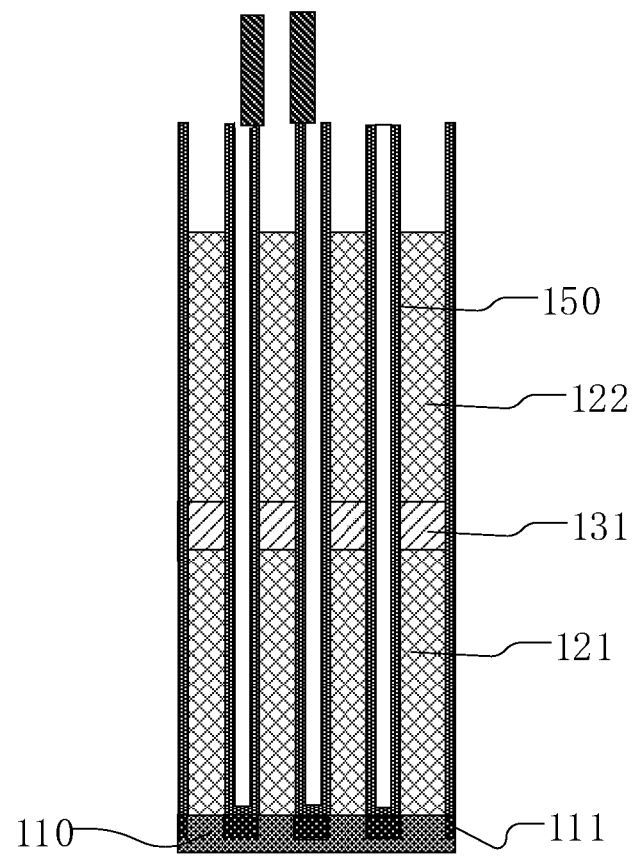
FIG. 19 is a schematic diagram of removing a second support layer according to a shielding structure in a method of manufacturing a semiconductor structure according to an exemplary embodiment.
Figure 20:
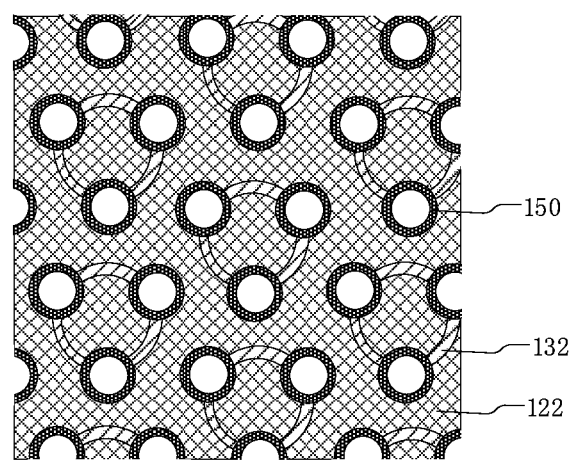
FIG. 20 is a top view of FIG. 19.

As shown in FIG. 19 and FIG. 20 with reference to FIG. 17 and FIG. 18, the second support layer 132 not shielded by the shielding structure 20 is first removed through dry etching or wet etching, to expose the second dielectric layer 122. As shown in FIG. 21, all the second dielectric layer 122 is removed through acid corrosion; as shown in FIG. 22, the first support layer 131 is exposed, and the first support layer 131 not shielded by the shielding structure 20 is continued to be removed through dry etching or wet etching. As shown in FIG. 23, the first dielectric layer 121 is exposed, all the first dielectric layer 121 is removed through acid corrosion, and a remaining part of the first support layer 131 and second support layer 132 are together used as the support structure 170.

In this embodiment, when the second support layer 132 is removed, only the part of the second support layer 132 shielded by the shielding structure 20 is retained. Therefore, a larger area of the second dielectric layer 122 is exposed, such that an operation opening for the process operation of removing the second dielectric layer is expanded; similarly, the process of removing the first support layer 131, and the first dielectric layer 121 is more convenient.

An exemplary embodiment of the present disclosure provides a semiconductor structure. As shown in FIG. 23 and FIG. 24, the semiconductor structure includes: a substrate 110, capacitor units 150 provided on the substrate 110, and a support structure 170 connected to partial sidewalls of some of the capacitor units 150. Capacitor contact regions 111 are provided in the substrate 110, and the capacitor units 150 are connected to the capacitor contact regions 111 respectively. For example, each of the capacitor units 150 may be a cup-shaped structure or a columnar structure.

As shown in FIG. 24, the support structure 170 is connected to partial sidewalls of some of the capacitor units 150 to connect some of the capacitor units 150 into a whole, thus enhancing the anti-tipping capability of the capacitor units 150, reducing the space occupied by the support structure 170 in the semiconductor structure, and increasing the available space in the semiconductor.

An exemplary of the present disclosure provides a semiconductor structure. This embodiment is substantially the same as the foregoing embodiment. The difference between this embodiment and the foregoing embodiment is that, as shown in FIG. 24, multiple support structures 170 are arranged among the capacitor units 150, and the support structures 170 are isolated from each other.

For example, as shown in FIG. 24, a plurality of capacitor contact regions 111 may be arranged in the substrate 110. A plurality of capacitor units 150 are correspondingly arranged at positions of the plurality of capacitor contact regions 111 respectively. By using one or more capacitor units 150 as a group, the capacitor units 150 in each group are connected by one support structure 170 to form a whole, such that each capacitor unit 150 can be connected to the support structure 170, and the capacitor units 150 in the semiconductor structure have higher stability and better anti-tipping performance.

An exemplary of the present disclosure provides a semiconductor structure. This embodiment is substantially the same as the foregoing embodiment. The difference between this embodiment and the foregoing embodiment is that, as shown in FIG. 24, the support structure 170 is connected to sidewalls of at least two capacitor units 150.

The more the number of capacitor units 150 connected to the support structure 170, the less space the support structure 170 occupies in the semiconductor structure, but the overall anti-tipping performance of multiple capacitor units 150 connected to the support structure 170 will be reduced. In this embodiment, as shown in FIG. 24, one support structure 170 connects three capacitor units, the line connecting the center points of the three capacitor units 150 forms a triangle, and the overall structure at the joints of the three capacitor units 150 has better anti-tipping performance and higher stability.

An exemplary of the present disclosure provides a semiconductor structure. This embodiment is substantially the same as the foregoing embodiment. The difference between this embodiment and the foregoing embodiment is that, as shown in FIG. 24, a projection pattern of the support structure 170 on the substrate includes multiple arc structures with the same radian.

For example, the support structure 170 includes multiple support units 171 with the same radian. Projections of the multiple support units 171 on the substrate are located on the same circle, wherein each support unit 171 is connected to sidewalls of the two capacitor units 150.

For example, as shown in FIG. 24, one support structure 170 connects three capacitor units 150. The support structure 170 includes three support units 171 with the same radian, and the three support units 171 sequentially connects the three capacitor units 150, such that the three capacitor units 150 form a whole, wherein the line connecting the center points of the three capacitor units 150 forms an inscribed triangle of the circle where the projections of the multiple support units 171 on the substrate 110 is located. In the semiconductor structure of this embodiment, the capacitor units 150 have the best anti-tipping performance and highest overall stability, and the semiconductor structure is the most stable.

Each embodiment or implementation in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of manufacturing a semiconductor structure and the semiconductor structure provided by the embodiments of the present disclosure, only the part of the support layers covered by the shielding structure is retained as the support structure, thus reducing the space occupied by the support structure in the semiconductor structure and increasing the available space in the semiconductor.

The invention claimed is:

1. A method of manufacturing a semiconductor structure, comprising:
   providing an initial structure, wherein the initial structure comprises a substrate, a laminated structure formed on the substrate, and capacitor units formed in the laminated structure, and the laminated structure comprises support layers;
   forming a first mask layer, wherein the first mask layer covers a top surface of the laminated structure;
   forming a first opening in the first mask layer, wherein the first opening exposes the top surface of the laminated structure, and a projection region of the first opening on the substrate at least partially overlaps with projection regions of the capacitor units on the substrate;
   forming a shielding structure, wherein the shielding structure is located in the first opening, and the shielding structure covers a sidewall of the first opening; and
   removing a part of the support layers according to a pattern defined by the shielding structure, wherein a remaining part of the support layers forms a support structure of the capacitor units.

2. The method of manufacturing a semiconductor structure of claim 1, wherein the forming a first opening in the first mask layer, wherein the first opening exposes the top surface of the laminated structure comprises:
   forming a photoresist mask layer on the first mask layer, wherein the photoresist mask layer defines a first pattern; and
   removing the first mask layer according to the first pattern, exposing the top surface of the laminated structure and forming the first opening.

3. The method of manufacturing a semiconductor structure of claim 1, wherein the projection region of the first opening on the substrate partially overlaps with each of multiple projection regions of multiple capacitor units on the substrate.

4. The method of manufacturing a semiconductor structure of claim 1, wherein the projection region of the first opening on the substrate covers multiple projection regions of multiple capacitor units on the substrate.

5. The method of manufacturing a semiconductor structure of claim 1, wherein the forming a shielding structure comprises:
   depositing a shielding material on the sidewall of the first opening along a thickness direction of the first mask layer and obtaining the shielding structure.

6. The method of manufacturing a semiconductor structure of claim 1, the method of manufacturing a semiconductor structure-further comprising:
   removing the first mask layer.

7. The method of manufacturing a semiconductor structure of claim 1, wherein the providing an initial structure comprises:
   providing the substrate, wherein capacitor contact regions are formed in the substrate;
   alternately forming dielectric layers and the support layers on the substrate and forming an initial laminated structure;
   forming a second mask layer on the initial laminated structure, wherein a second pattern is defined on the second mask layer;
   removing a portion of the initial laminated structure the second pattern and forming target holes, wherein the target holes expose the capacitor contact regions respectively, and forming the laminated structure; and
   forming the capacitor units in the target holes respectively.

8. The method of manufacturing a semiconductor structure of claim 7, wherein the forming the capacitor units in the target holes respectively comprises:
   providing an electrode material, wherein the electrode material at least covers a bottom wall and a sidewall of each of the target holes.

9. The method of manufacturing a semiconductor structure of claim 7, wherein the forming the capacitor units in the target holes respectively comprises:

providing an electrode material, wherein the electrode material fills the target holes.

10. The method of manufacturing a semiconductor structure of claim 7, wherein the removing a part of the support layers a pattern defined by the shielding structure, wherein a remaining part of the support layers forms a support structure of the capacitor units comprises:
sequentially removing the dielectric layers, and the support layers not shielded by the pattern defined by the shielding structure, and forming the support structure.

11. A semiconductor structure, comprising:
a substrate, wherein capacitor contact regions are provided in the substrate;
capacitor units, wherein the capacitor units are provided on the substrate and connected to the capacitor contact regions respectively; and
a support structure, wherein the support structure is connected to partial sidewalls of some of the capacitor units;
wherein the semiconductor structure is manufactured by a method comprising:
providing an initial structure, wherein the initial structure comprises the substrate, a laminated structure formed on the substrate, and the capacitor units formed in the laminated structure, and the laminated structure comprises support layers;
forming a first mask layer, wherein the first mask layer covers a top surface of the laminated structure;
forming a first opening in the first mask layer, wherein the first opening exposes the top surface of the laminated structure, and a projection region of the first opening on the substrate at least partially overlaps with projection regions of the capacitor units on the substrate;
forming a shielding structure, wherein the shielding structure is located in the first opening, and the shielding structure covers a sidewall of the first opening; and
removing a part of the support layers a pattern defined by the shielding structure, wherein a remaining part of the support layers forms the support structure of the capacitor units.

12. The semiconductor structure of claim 11, wherein multiple support structures are arranged among the capacitor units, and the support structures are isolated from each other.

13. The semiconductor structure of claim 12, wherein each of the support structures is connected to sidewalls of at least two of the capacitor units.

14. The semiconductor structure of claim 13, wherein a projection pattern of each of the support structures on the substrate comprises multiple arc structures with a same radian.

15. The semiconductor structure of claim 11, wherein each of the capacitor units is a cup-shaped structure or a columnar structure.

* * * * *